(12) United States Patent
Wang et al.

(10) Patent No.: US 11,631,619 B2
(45) Date of Patent: Apr. 18, 2023

(54) ARRAY SUBSTRATE AND FABRICATING METHOD THEREOF, DISPLAY PANEL AND DISPLAY DEVICE

(71) Applicants: Hefei Xinsheng Optoelectronics Technology Co., Ltd., Hefei (CN); Boe Technology Group Co., Ltd., Beijing (CN)

(72) Inventors: Haitao Wang, Beijing (CN); Guangyao Li, Beijing (CN); Jun Wang, Beijing (CN); Qinghe Wang, Beijing (CN); Dongfang Wang, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/694,831

(22) Filed: Nov. 25, 2019

(65) Prior Publication Data

US 2020/0251392 A1 Aug. 6, 2020

(30) Foreign Application Priority Data

Jan. 31, 2019 (CN) .......................... 201910100367.3

(51) Int. Cl.
*H01L 21/66* (2006.01)
*H01L 23/58* (2006.01)
(Continued)

(52) U.S. Cl.
CPC ............ *H01L 22/34* (2013.01); *H01L 23/585* (2013.01); *H01L 23/60* (2013.01);
(Continued)

(58) Field of Classification Search
CPC ......... H01L 23/58; H01L 21/66; H01L 23/60; H01L 27/12; H01L 29/786; H01L 22/34;
(Continued)

(56) References Cited

U.S. PATENT DOCUMENTS 5,331,396 A * 7/1994 Yukawa ................. G01N 21/94
356/239.8
6,046,101 A * 4/2000 Dass .................... H01L 23/3171
438/624

(Continued)

FOREIGN PATENT DOCUMENTS

CN 102540508 A 7/2012
CN 204720446 U 10/2015
(Continued)

OTHER PUBLICATIONS

First Office Action for CN Patent Application No. 201910100367.3 dated Aug. 4, 2020.
(Continued)

*Primary Examiner* — Sheng-Bai Zhu
(74) *Attorney, Agent, or Firm* — Perilla Knox & Hildebrandt LLP; Kenneth A. Knox

(57) ABSTRACT

Embodiments of the present disclosure provide an array substrate comprising a base substrate, a buffer layer disposed on the base substrate, an interlayer dielectric layer disposed on the buffer layer, and a protection layer disposed on the interlayer dielectric layer, where the array substrate further comprises a plurality of first test units and a plurality of test leads. The plurality of test leads are connected to the plurality of first test units in a one-to-one correspondence, and the plurality of test leads are disposed in at least two different layers. A method for manufacturing an array substrate, a display panel, and a display device are further provided.

14 Claims, 6 Drawing Sheets

(51) Int. Cl.
  *H01L 27/12* (2006.01)
  *H01L 29/786* (2006.01)
  *H01L 23/60* (2006.01)
(52) U.S. Cl.
  CPC ...... *H01L 27/1244* (2013.01); *H01L 27/1259* (2013.01); *H01L 29/78633* (2013.01)
(58) Field of Classification Search
  CPC .............. H01L 23/585; H01L 27/1244; H01L 27/1259; H01L 29/78633
  USPC .......................................................... 257/48
  See application file for complete search history.

(56) References Cited

U.S. PATENT DOCUMENTS

| | | | | |
|---|---|---|---|---|
| 6,483,043 | B1* | 11/2002 | Kline | ............... H01L 23/50 257/E23.079 |
| 2004/0032544 | A1* | 2/2004 | Kim | ............... G02F 1/136204 349/40 |
| 2006/0250615 | A1* | 11/2006 | Fukuhara | ............ G03F 7/70566 356/364 |
| 2007/0181989 | A1* | 8/2007 | Corisis | .................... H01L 24/46 257/686 |
| 2008/0117345 | A1* | 5/2008 | Ishii | .................. G02F 1/136204 349/40 |
| 2008/0246502 | A1* | 10/2008 | Hong | ................. G01R 31/2884 324/750.3 |
| 2009/0002012 | A1* | 1/2009 | Doong | ............... G01R 31/2853 324/762.03 |
| 2011/0128031 | A1* | 6/2011 | Watanabe | .......... G01R 31/2889 324/762.01 |
| 2016/0328062 | A1* | 11/2016 | Jin | ...................... G02F 1/13338 |
| 2017/0025075 | A1 | 1/2017 | Cok et al. | |

FOREIGN PATENT DOCUMENTS

| | | |
|---|---|---|
| CN | 108565223 A | 9/2018 |
| CN | 108732833 A | 11/2018 |
| JP | H0410744 B2 | 2/1992 |

OTHER PUBLICATIONS

Second Office Action for CN Patent Application No. 201910100367.3 dated Apr. 30, 2021.
Third Office Action for Chinese Patent Application No. 201910100367.3 dated Oct. 12, 2021.

\* cited by examiner

ARRAY SUBSTRATE AND FABRICATING METHOD THEREOF, DISPLAY PANEL AND DISPLAY DEVICE

CROSS-REFERENCE TO RELATED APPLICATION

This application is based upon and claims priority to Chinese Patent Application No. 201910100367.3, filed on Jan. 31, 2019, the entire content of which are incorporated herein by reference.

TECHNICAL FIELD

Embodiments of the present disclosure relate to an array substrate and a fabricating method thereof, a display panel having the array substrate, and a display device with the display panel.

BACKGROUND

In manufacturing a display panel, in order to monitor and detect a electrical failure (such as signal disconnection, short circuit or the like) in the active area (AA) of the display panel, some test element groups are provided in the non-display area of the display panel. These test element groups are used to test the picture display effect of the AA area in the display panel and resistance between metal wires in a gate layer and a source/drain layer, and the like.

Referring to a structure diagram of a test element group provided in the non-display area of an array substrate as shown in FIG. 1, there are up to ten test units 1 in the test element group, so leads 2 connected to the test units 1 are denser and narrower due to limitation of space, and, as a result, a short circuit between the leads 2 tends to occur. Moreover, during testing, when a voltage is applied, when the voltage is unstable or is too instantaneously great, the test unit 1 is prone to break down by electrostatic and burns, resulting in that subsequent tests cannot occur.

SUMMARY

At least one embodiments of the present disclosure provide an array substrate, comprising: a base substrate, a buffer layer disposed on the base substrate, an interlayer dielectric layer disposed on the buffer layer, and a protection layer disposed on the interlayer dielectric layer, wherein the array substrate further comprises a plurality of first test unit and a plurality of test leads disposed on the base substrate, wherein the plurality of test leads are connected to the plurality of first test units in one-to-one correspondence, and the plurality of test leads are disposed in at least two different layers.

At least one embodiments of the present disclosure provide a method for manufacturing an array substrate, comprising: forming a plurality of first test units and a plurality of test leads on a base substrate, wherein the plurality of test leads are connected to the plurality the plurality of first test units in one-to-one correspondence, and the plurality of test leads are disposed in at least two different layers.

At least one embodiments of the present disclosure provide a display panel, comprising the array substrate as described above.

At least one embodiments of the present disclosure provide a display device, comprising the array panel as described above.

In the array substrate according to the embodiments of the present disclosure, a plurality of first test units and a plurality of test leads are disposed on the base substrate, and the respective test lead is connected to the respective first test unit, and the plurality of test leads are disposed in at least two different layers, such that distance between test leads increase, and distance between adjacent test leads disposed in the same layer also increases, and it is difficult for failure of shorting circuit to occur between test leads.

BRIEF DESCRIPTION OF THE DRAWINGS

The above and other features and advantages of the present disclosure will become more apparent by referring to detailed description of exemplary embodiments.

DETAILED DESCRIPTION

Figure 1:
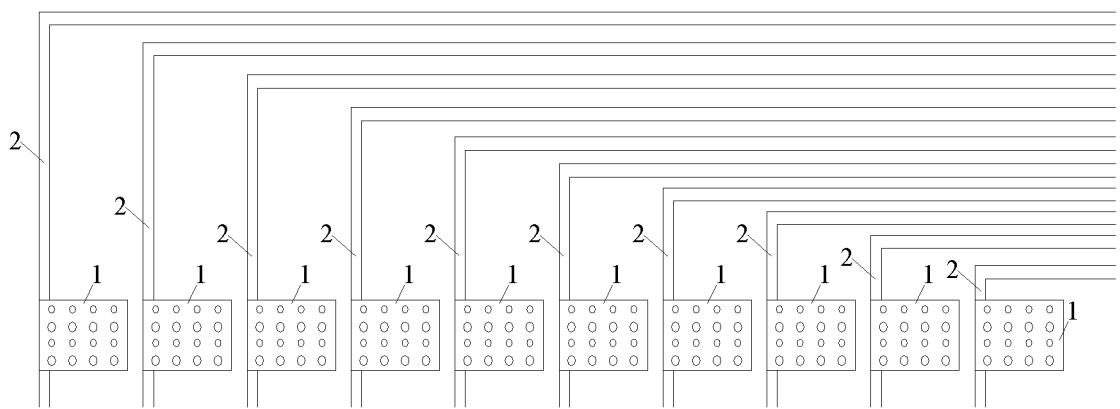
FIG. 1 is a schematic diagram of the structure of a test unit provided in the non-display area of an array substrate.

Exemplary embodiments will now be described more fully with reference to the accompanying drawings. However, the exemplary embodiments can be embodied in various manners, and should not be construed as a limit to the embodiments set forth herein. On the contrary, these embodiments are provided so that this disclosure will be more comprehensive and complete, and the concept of the exemplary embodiments can be fully conveyed to those skilled in the art. The same reference numerals in the drawings represent the same or similar parts, and the detailed description thereof will be omitted.

The reference numerals for the figures are as follows:
100. test unit;
200. lead;
1. connecting wires;
2. Test lead;
21. First test lead;
22. Second test lead;
23. Third test lead;
3. First test unit;
31. First test conductor layer;
32. Second test conductor layer;
33. First electrostatic test unit;
34. First power test unit;
35. First backup test unit;
36. First sensing transistor test unit;
4. Second test unit;
41. First detecting conductor layer;
42. Second detecting conductor layer;
43. Second electrostatic test unit;
44. Second power test unit;
45. Second backup test unit;
46. Second sensing transistor test unit;
5. Electrostatic ring;
51. Active layer;
52. Gate;
53. Source;
54. Drain;

55. Gate insulating layer;
6. Base substrate;
7. Buffer layer;
8. Interlayer dielectric layer;
9. Protection layer;
10. Gate connecting line;
12. Drain connecting line;
13. Through hole.

Figure 2:
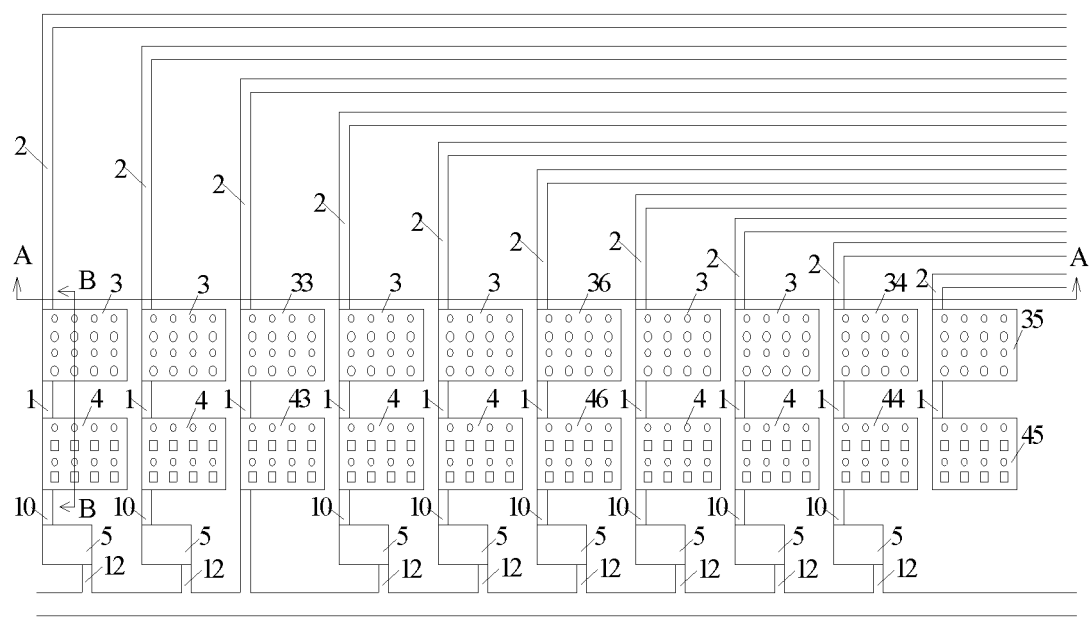
FIG. 2 is a schematic structural view of the structure of an array substrate according to an exemplary embodiment of the present disclosure.

At least one embodiments of the present disclosure provides an array substrate. FIG. 2 illustrates a schematic structural view of an array substrate according to an embodiment of the present disclosure. As illustrated in FIG. 2, the array substrate comprises a base substrate 6, a plurality of first test units 3, and a plurality of test leads 2 disposed on the base substrate 6, where the plurality of test leads 2 are connected to the plurality of first test units 3 in one-to-one correspondence, and the plurality of test leads 2 are disposed in at least two different layers.

As illustrated in FIG. 2, in an embodiment of the present disclosure, the array substrate further comprises a plurality of second test units 4 and a plurality of connecting wires 1, where both the plurality of second test units 4 and the plurality of connecting wires 1 are disposed on the base substrate, and the plurality of connecting wires 1 are configured to connect the first test units and the second test units in a one-to-one correspondence.

The respective test units are connected to a corresponding leads under test (e.g., source/drain of red pixel, source/drain of white pixel, source/drain of blue pixel, source/drain of green pixel, sensor, power line, etc.) of the display area through the respective test lead. During the test, an external signal applying unit is connected to the test unit, and a test signal is applied to the test unit. The test signal is transmitted to respective wires under test through the test unit and the test lead to detect whether the respective wires under test are subject to failures, such as open circuit or short circuit.

For example, in an exemplary embodiment, there are a plurality of first test units 3 (for example, ten) that are provided on the array substrate. Each test unit 3 requires one test lead 2, that is, it is required that the number of the first test units 3 is the same as the number of the test leads 2. The first test units 3 may comprise a first electrostatic test unit 33, a first power test unit 34, a first backup test unit 35, a first sensing transistor test unit 36, and the like. Of course, the number of the first test units 3 and the number of the test leads 2 are merely illustrative, the number of which is not limited herein.

Figure 3:
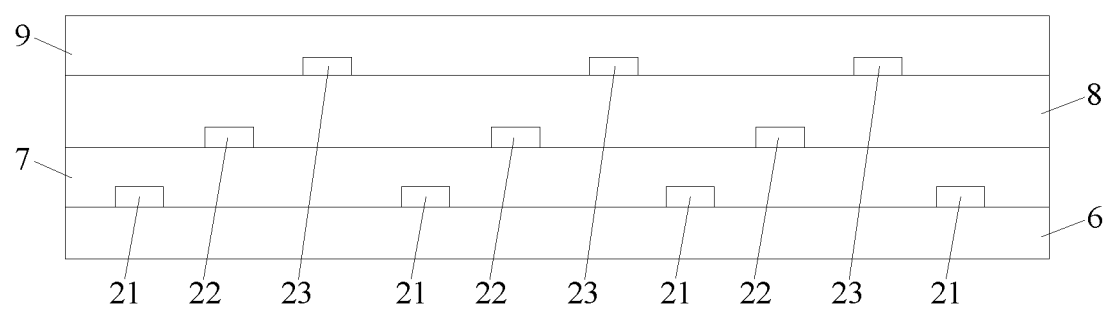
FIG. 3 is a schematic diagram of the structure taken along the line A-A in FIG. 2.

Referring to FIG. 3, which is a schematic structural view taken along the line A-A in FIG. 2. In the exemplary embodiment, the test lead 2 can comprise four first test leads 21, three second test leads 22, three third test leads 23, and the first test leads 21, where the second test leads 22 and the three test leads 23 are disposed in sequence, that is, the arrangement of the ten test leads 2 is the first test lead 21, the second test lead 22, the third test lead 23, the first test lead 21, the second test lead 22, the third test lead 23, the first test lead 21, the second test lead 22, the third test lead 23, and the first test lead 21. As illustrated in FIG. 3, the first test lead 21, the second test lead 22, and the third test lead 23 are disposed in different layers.

In an embodiment of the present disclosure, the first test lead 21 can be disposed in the same layer as a light shielding layer. For example, both the first test lead 21 and the light shielding layer are disposed between the base substrate 6 and the buffer layer 7. The light shielding layer can be made of metal, and then, the first test lead 21 and the light shielding layer can be formed through a single patterning process.

A single patterning process refers to a process of depositing a material layer, coating photoresist, applying one or more exposing, performing one or more etching, or other process for forming a pattern of the material layer.

In an embodiment of the present disclosure, the second test lead 22 can be disposed between the buffer layer 7 and an interlayer dielectric layer 8. Also, a gate 52 can be disposed between the buffer layer 7 and the interlayer dielectric layer 8. Then, the second test lead 22 and the gate can be formed through a single patterning process.

In an embodiment of the present disclosure, the third test lead 23 can be disposed between the interlayer dielectric layer 8 and a protection layer 9. A source/drain can also be disposed between the interlayer dielectric layer 8 and the protection layer 9. Then, the third test lead 23 and the source/drain can be formed through a single patterning process.

Through the arrangement as described above, the distance between the adjacent two test leads 2 increases, the distance between the test leads 2 disposed in the same layer increases, and short-circuit defects do not easily occur between the test leads 2.

Of course, arrangements for the test leads are not limited to the arrangement as described. In an embodiment of the present disclosure, adjacent test leads are disposed in different layers. For example, the first test lead 21 and the second test lead 22 are adjacent to each other are disposed in different layers, the second test lead 22 and the third test lead 23 are adjacent to each other are disposed in different layers, and the third test lead 23 and the first test lead 21 are adjacent to each other are disposed in different layers. Disposing two adjacent test leads 2 in different layers increases distance between two adjacent test leads and, at the same time, increases two adjacent test leads which are disposed in the same layer, such that failure of shorting does not easily occur between test leads 2. In one embodiment, five adjacent test leads among the ten test leads 2 are disposed in a layer, and other five adjacent test leads are disposed in a layer, thus, the number of test leads which are disposed in one layer decreases, and shorting failures do not easily occur between the test leads 2. It should be noted that the number of test leads 2 disposed in the same layer is not limited to above description, and may be more than five or less than five, for example.

In an embodiment of the present disclosure, as illustrated in FIG. 2, the array substrate may further comprise a plurality of test units 4 and a plurality of connecting wires 1. The plurality of second test units 4 and the plurality of connection wires 1 are disposed on the base substrate 6. The plurality of second test units 4 are connected to the plurality of first test unit 3 in a one-to-one correspondence through corresponding connection wires 1. The plurality of second test units 4 may comprise a second electrostatic test unit 43, a second power test unit 44, a second backup test unit 45, a second sensing transistor test unit 46, and the like. Of course, in the present disclosure, the number of the second test unit 4 and the number of the connecting wires 1 are not limited, as long as the number of the second test units 4 is the same as the number of the first test units 3, and the number of the connecting wires 1 is the same as the number of the first test units 3.

Figure 4:
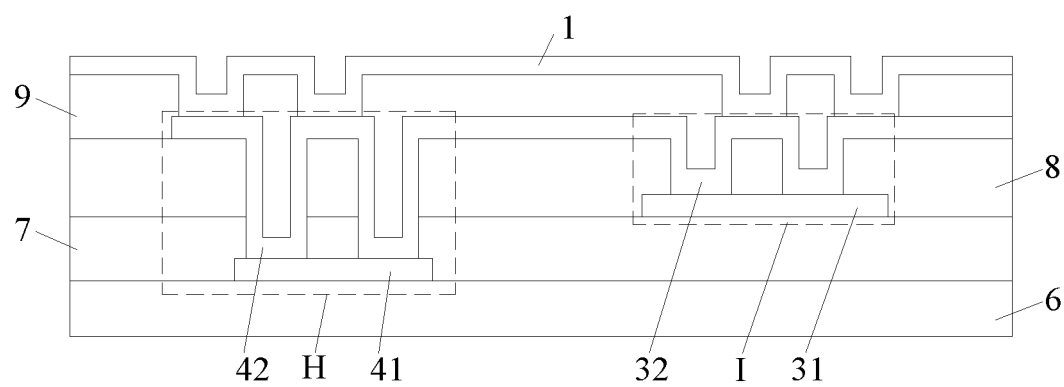
FIG. 4 is a schematic diagram of the structure taken along the line B-B in FIG. 2.

FIG. 4 illustrates a schematic structural view taken along the line B-B in FIG. 2. The first test unit is indicated by I and the second test unit is indicated by H in FIG. 4.

The first test unit can comprise a first test conductor layer 31 and a second test conductor layer 32. The first test conductor layer 31 is disposed on the base substrate 6, the second test conductor layer 32 is disposed on the interlayer dielectric layer 8, and the second test conductor layer 32 is connected to the first test conductor layer 31 through a first via provided in the interlayer dielectric layer 8. In one embodiment of the present disclosure, the first test conductor layer 31 and the gate can be disposed in a same layer, and can be formed through a single patterning process. The second test conductor layer 32 and the source/drain are disposed on the same layer, and can be formed through a single patterning process. In another embodiment of the present disclosure, the first test conductor layer 31 and the source/drain can be disposed in the same layer, and can be formed through a single patterning process. Also, the second test conductor layer 32 and the gate can be disposed in the same layer, and can be formed through a single patterning process.

The second test unit 4 can include a first detecting conductor layer 41 and a second detecting conductor layer 42. The first detecting conductor layer 41 is disposed on the base substrate 6, and the second detecting conductor layer 42 is disposed on the interlayer dielectric layer 8, where the buffer layer 7 and the interlayer dielectric layer 8 are disposed between the first detecting conductor layer 41 and the second detecting conductor layer 42. A third via is provided in the buffer layer, and a second via is provided in the interlayer dielectric layer 8. Also, the second via and the third via are aligned with each other in a direction perpendicular to the base substrate 6, such that the second via and the third via are in communication with each other, and the second detecting conductor layer 42 is connected to the first detecting conductor layer 41 through the second via and the third via. In an embodiment of the present disclosure, the first detecting conductor layer 41 can the light shielding layer can be disposed in the same layer, and can be formed through a single patterning process. The second detecting conductor layer 42 and the source/drain can be disposed in the same layer and can be formed through a single patterning process. In another embodiment of the present disclosure, the first detecting conductor layer and the source/drain can be disposed in the same layer, and can be formed through a single pattering process. Additionally, the second detecting conductor layer and the light shielding layer can be disposed in the same layer and can be formed through a single patterning process.

Of course, when the first test conductor layer 13 or the second test conductor layer 32 is disposed in the same layer as the source/drain, and the first detecting conductor layer 41 or the second detecting conductor layer 42 is disposed in the same layer as the source/drain, the first test conductor layer 31 or the second test conductor layer 32, and the first detecting conductor layer 41 or the second detecting conductor layer 42, and the source/drain are formed through a single patterning process. Of course, the first detecting conductor layer 41 and the first test conductor layer 31 can be disposed in the same layer. When the first detecting conductor layer 41, the first test conductor layer 31, and the gate are disposed in the same layer, the first detecting conductor layer 41, the first test conductor layer 31, and the gate can be formed through a single patterning process. When the first test conductor layer 31, the first detecting conductor layer 41, and the light shielding layer are disposed in the same layer, the first test conductor layer 31, the first detecting conductor layer 41, and the light shielding layer are disposed in the same layer, and can be formed through a single patterning process.

A protection layer 9 is disposed on the second test conductor layer 32 and the second detecting conductor layer 42. The connecting wire 1 is disposed on the protection layer 9. When an electrode layer of the array substrate is also provided on the protection layer, the connecting wire and the electrode layer can be formed through a single pattering process.

When applying an voltage during in the test, if the applied voltage is unstable or is oversized instantaneously, electrostatic breakdown tends to occur, and the first test unit 3 will be burned down, such that the first test conductor layer 31 and the second test conductor layer 32 are disconnected. However, as the first test unit 3 is connected to the second test unit 4 through the connecting wire, the test can be continued through the second test unit 4.

Referring to FIG. 2, in the present exemplary embodiment of the present disclosure, the array substrate may further comprise a plurality of electrostatic rings 5. The plurality of electrostatic rings 5 are connected to the plurality of second test units 4 other than the second electrostatic test unit 43 and the second backup test unit 45 in a one-to-one correspondence. Of course, one additional electrostatic ring 5 can further be disposed and is connected to the second backup test unit 45, as static electricity at the plurality of second test units 4 other than the second electrostatic test unit 43 is required to be transmitted to the second electrostatic test unit 43.

Figure 5:
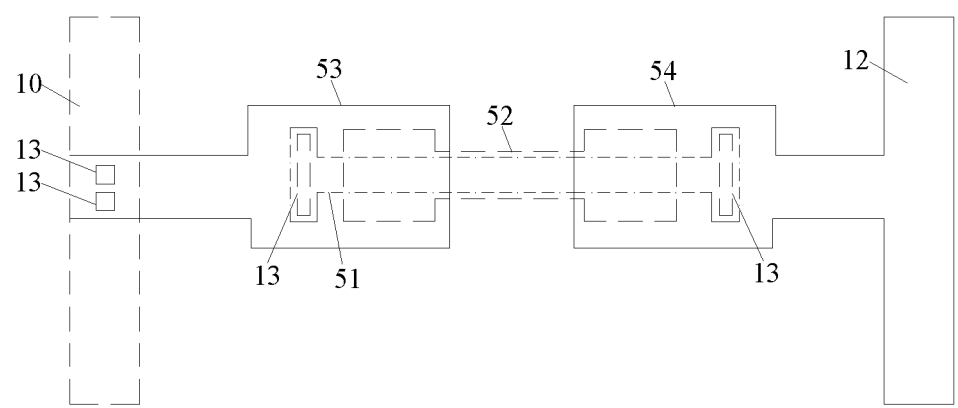
FIG. 5 is a schematic diagram of the structure of an electrostatic ring in FIG. 2.
Figure 6:
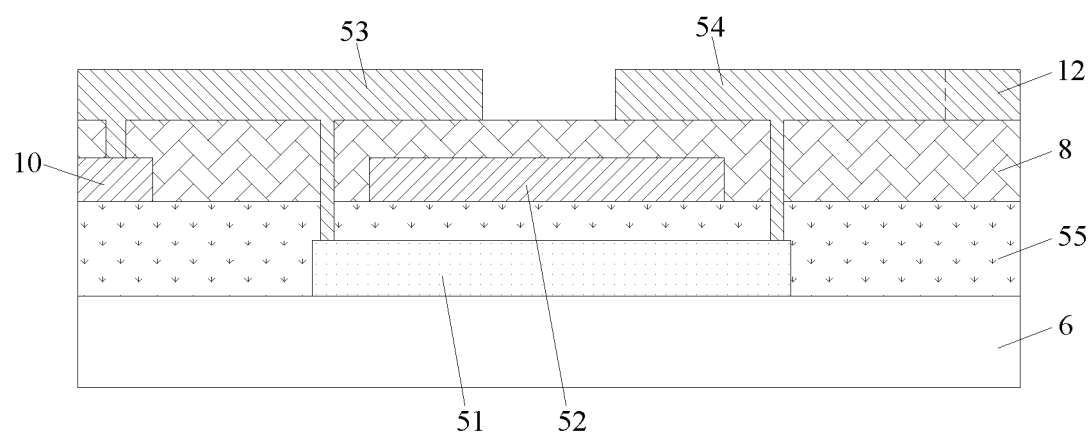
FIG. 6 is a schematic cross-sectional view of FIG. 5.

Referring now to FIG. 5 and FIG. 6, FIG. 5 illustrates a plan view of the electrostatic ring 5 in FIG. 2, and FIG. 6 illustrates a cross-sectional view of the electrostatic ring 5 in FIG. 2. As illustrated in FIG. 6, the electrostatic ring 5 can comprise a thin film transistor, which can comprise an active layer 51 disposed on the base substrate 6, a gate insulating layer 55 disposed on the active layer 51, a gate 52 disposed on the gate insulating layer 55, and an interlayer dielectric layer 8 disposed on the gate 52. A via hole 13 is provided in the interlayer dielectric layer 8, and a source 53 and a drain 54 are disposed on the interlayer dielectric layer 8 and connected to the active layer 51 through the via hole 13. The gate connecting line 10 is formed while forming the gate 52. The plurality of second test units 4 other than the second electrostatic test unit 43 and the second backup test unit 45 are connected to the source 53 in the electrostatic ring 5 through the gate connecting line 10 in a one-to-one correspondence. A source connecting line and a drain connecting line 12 are formed while forming the source/drain. The drain connecting line 12 is connected to the electrostatic test unit, and the electrostatic test unit is connected to the drain 54 in the electrostatic ring 5 through the source drain connecting line 12, thereby, the plurality of second test units 4 other than the second electrostatic test unit 43 and the second backup test unit 45 are connected to the second electrostatic test unit 43 in a one-to-one correspondence. During testing or processing, once the static electricity is generated, the voltage of the gate 52 of the electrostatic ring 5 is rapidly boosted by capacitive coupling, and the static electricity will be discharged rapidly, greatly reducing damage caused by the static electricity.

Further, embodiments of the present disclosure provide a method for fabricating an array substrate, comprising: forming a plurality of first test units 3 and a plurality of test leads 2 on a base substrate 6, where the plurality of test leads 2 are connected to the plurality of first test units 3 in a one-to-one correspondence, and the plurality of test leads are disposed in at least two different layers.

In an array substrate manufactured by the method for manufacturing an array substrate according to the embodiments of the present disclosure, a transistor is formed in the active area of the array substrate and, at the same time, a first test unit 3, a second test unit 4, an electrostatic ring 5, a test lead 2, a connecting wire 1 connecting the first test unit 3 and the second test unit 4, a gate connecting line 10 connecting the second test unit 4 and an electrostatic ring 5, and a drain connecting line 12 are formed. It is only required to modify the existing mask without additional mask processing, such that the processing is simple and the production cost is low.

The process of manufacturing an array substrate will be described hereinafter.

A metal material layer is formed on the base substrate 6, and the metal material layer is patterned to form a metal light shielding layer in the active area. A first test lead 21 and a first detecting conductor layer 41 are formed in the non-display area.

A buffer layer 7 is formed on the light shielding metal layer, the first detecting conductor layer 41, and the first test lead 21.

An active material layer is formed on the buffer layer 7, and the active material layer is patterned so as to form an active layer of a thin film transistor in the active area and an active layer 51 of the electrostatic ring 5 in the non-display area.

A gate insulating layer is formed on the active layer 51. The gate insulating layer can be made of silicon oxide, silicon nitride, silicon oxynitride, or the like.

A gate material layer is formed on the gate insulating layer, and the gate material layer is patterned so as to form a gate in the effective display area, a first test conductor layer 31, a second test lead 22, the gate 52 of the electrostatic ring 5, and a gate connecting line 10 connecting the second test unit 4 and the electrostatic ring 5 in the non-display area. It should be noted that each of the plurality of second test units 4, except the second electrostatic test unit 43 and the second backup test unit 45, is connected with a gate connecting line 10. Therefore, it is not necessary to form a gate connecting line 10 at the second electrostatic test unit 43 and the second backup test unit 45.

An interlayer dielectric layer 8 is formed for coating the buffer layer 7, and the interlayer dielectric layer 8 is pattered so as to form a first via hole in the first test unit area, a second via hole in the second test unit area, and a through hole 13 in the electrostatic ring area. Then, the buffer layer 7 in the second test unit area is patterned to form a third via hole, which is communicated with the second via hole. In the present embodiment, each of the number of the first via hole, the number of the second via hole, and the number of the third via hole can be one or more, and the number of the second via holes and the number of the third via holes are the same, and the second via holes are communicated with the third via holes in a one-to-one correspondence.

A source/drain material layer is formed on the interlayer dielectric layer 8, and the source/drain material layer is patterned to form source/drain in the active area and a second test conductor layer 32, a second detecting conductor layer 42, a third test lead 23, and a drain connecting line 12 in the non-display area. Additionally, at the same time, a source 53 and a drain 54 of the electrostatic ring 5 are formed, and the source 53 and the drain 54 of the electrostatic ring 5 are connected to the active layer 51 through the through holes 13. It should be noted that the drain connecting line 12 is connected to the second electrostatic test unit 43. Therefore, it is only necessary to form a drain connecting line 12 at the second electrostatic test unit 43, and the drain connecting line 12 extends to remaining second test units 4, so that the electrostatic ring 5 connected to the remaining second test units 4 is connected to the drain connecting line 12.

The second test conductor layer 32 is connected to the first test conductor layer 31 through the first via hole so as to form the first test unit 3. The second detecting conductor layer 42 is connected to the first detecting conductor layer 41 through the second via hole and the third via hole to form the second test unit 4. The source 53 of the electrostatic ring 5 is connected to the gate connecting line 10 through the through hole 13, such that the plurality of electrostatic rings 5 are connected to the plurality of second test units 4 other than the second electrostatic test unit 43 and the second backup test unit 45 in a one-to-one correspondence. The drain 54 of the electrostatic ring 5 is connected to the drain connecting line 12 and the drain 54 of the electrostatic ring 5, and the source drain connecting line 12 can be integrally formed so that the electrostatic ring 5 is connected to the second electrostatic test unit 43 to transfer the static electricity generated at the first test unit 3 and the second test unit 4 to the electrostatic test unit.

A protection layer 9 is formed on the source drain electrode, the second test conductor layer 32, and the plurality of third test leads 23. The protective layer 9 is patterned to form a fifth via hole in the first test unit area and a fourth via hole in the second test unit area.

An electrode material layer is formed on the protection layer 9, and the electrode material layer is patterned to form an electrode in the active area and a connecting wire 1 in the non-display area, and the connecting wire 1 is connected to the second test conductor layer 32 through the fifth via hole and to the second detecting conductor layer 42 through the fourth via hole, the third via hole, and the second via hole. Thus, the connecting wire 1 connects the first test unit 3 and the second test unit 4.

Further, at least one embodiments of the present disclosure provides a display panel, comprising the array substrate described above. The structure and the manufacturing process of the array substrate have been described in detail in the foregoing, and therefore will not be elaborated here.

Further, at least one embodiments of the present disclosure provides a display device, comprising the display panel described above. The structure and the manufacturing process of the display panel have been described in detail in the foregoing, and therefore will not be elaborated herein.

The features, structures, or characteristics described above can be combined in any suitable manner in one or more embodiments, if possible. If possible, the features discussed in the various embodiments are interchangeable. In the description above, the details are set forth to provide a thorough understanding of the embodiments of the disclosure. However, one of ordinary skill in the art will appreciate that the technical solutions of the present disclosure can be practiced without one or more of the details, or other methods, components, materials, etc. can be adopted. In other cases, well-known structures, materials, or operations are not illustrated or described in detail to avoid obscuring aspects of the present disclosure.

Although relative terms such as "above" and "below" are used in this specification to describe the relative relationship between one component and another component, these terms are used in this specification only for convenience to illustrate such as the orientation of the embodiments described in the drawings. It should be understood that, if the device in the figure is turned upside down, the component described as "above" will become the component as "below". When a structure is "on" another structure, it may mean that the structure is integrally formed on the said another structure, or that the structure is "directly" disposed on the said another structure, or that the structure is "indirectly" disposed on the said another structure through a further another structure.

The terms "a", "an", "the", "said", and "at least one" are used to express the presence of one or more elements/components, etc. The terms "include", "comprise", and "have" are used to express the meaning of an opening inclusion, and refer to that, in addition to the listed elements, components, etc., there may be additional elements, components, etc.; and the terms "first", "second", "third", and etc. are used merely as labels and are not limited to the number of objects.

It should be understood that the present disclosure does not limit to the detailed structure and arrangement of the components presented in the specification. The present disclosure can have other embodiments and can be implemented and executed in a variety of ways. The foregoing variations and modifications are intended to fall within the scope of the present disclosure. It should be understood that the disclosure disclosed and claimed by the specification extends to all alternative combinations of two or more individual features that are mentioned or apparent in the text and/or drawings. All of these different combinations constitute a number of alternative aspects of the present disclosure. The embodiments described in the specification are illustrative of the best mode of the present disclosure, and will enable those skilled in the art to utilize this disclosure.

What is claimed is:

1. An array substrate, comprising:
a base substrate,
a buffer layer disposed on the base substrate,
an interlayer dielectric layer disposed on the buffer layer, and
a protection layer disposed on the interlayer dielectric layer, wherein:
the array substrate further comprises:
a transistor, and a metal light shielding layer; and
a plurality of first test units, a plurality of second test units, a plurality of test leads, and a plurality of connecting wires, wherein:
for the plurality of first test units:
the plurality of first test units comprise at least one of: a first electrostatic test unit, a first power test unit, a first backup test unit, a first sensing transistor test unit;
each of the plurality of first test units comprises two layers of test conductor layers arranged by stack,
the two layers of test conductor layers are connected to each other, the interlayer dielectric layer is disposed between the two layers of test conductor layers, and
one layer of test conductor layers is disposed in a same layer with a source/drain of the transistor, and the other layer of test conductor layers is disposed in a same layer with a gate of the transistor;
for the plurality of second test units:
the plurality of second test units comprise at least one of: a second electrostatic test unit, a second power test unit, a second backup test unit, a second sensing transistor test unit;
each of the plurality of second test units comprises two layers of detecting conductor layers arranged by stack,
the two layers of detecting conductor layers are connected to each other, the buffer layer and the interlayer dielectric layer are disposed between the two layers of detecting conductor layers, and
one layer of detecting conductor layers is disposed in a same layer with the metal light shielding layer, and the other layer of detecting conductor layers is disposed in a same layer with the source/drain of the transistor; and
for the plurality of test leads:
the plurality of test leads are connected to the plurality of first test units in a one-to-one correspondence;
the plurality of test leads are disposed in at least two different layers;
the plurality of test leads comprise at least two of: a first test lead, a second test lead, and a third test lead, the first test lead being disposed in the metal light shielding layer in a same layer, the second test lead being disposed in a same layer as the gate of the transistor, the third test lead being disposed in a same layer as the source/drain of the transistor; and
for the plurality of connecting wires:
the respective connecting wires are connected between the plurality of first test units and the plurality of second test units in a one-to-one correspondence.

2. The array substrate according to claim 1, wherein:
the first test lead and the metal light shielding layer are disposed between the base substrate and the buffer layer;
the second test lead and the gate are disposed between the buffer layer and the interlayer dielectric layer; and
the third test lead and the source/drain are disposed between the interlayer dielectric layer and the protection layer.

3. The array substrate according to claim 2, wherein the two layers of test conductor layers comprise:
a first test conductor layer disposed between the buffer layer and the interlayer dielectric layer; and
a second test conductor layer disposed on the interlayer dielectric layer and connected to the first test conductor layer through a first via hole provided in the interlayer dielectric layer.

4. The array substrate according to claim 1, wherein the two layers of detecting conductor layers comprises:
a first detecting conductor layer disposed on the base substrate; and
a second detecting conductor layer disposed on the interlayer dielectric layer, wherein the second detecting conductor layer is connected to the first detecting conductor layer through a second via hole provided in the interlayer dielectric layer and a third via hole provided in the buffer layer.

5. The array substrate according to claim 1, further comprising an electrode layer, wherein the connecting wire and the electrode layer are disposed in a same layer and are made of a same material.

6. The array substrate according to claim 5, wherein the connecting wire and the electrode layer are disposed on the protection layer.

7. The array substrate according to claim 1, further comprising a plurality of electrostatic rings, wherein each of the plurality of second test units comprises an electrostatic test unit, and the plurality of electrostatic rings are connected to a part of the plurality of second test units in a one-to-one correspondence.

8. The array substrate according to claim 7, wherein each of the plurality of electrostatic rings comprises a thin film transistor, a drain of which being connected to the electrostatic test unit.

9. The array substrate according to claim 1, wherein:
the first test lead and the metal light shielding layer are made of a same material;
the second test lead and the gate of the transistor are made of a same material; and
the third test lead and the source/drain of the transistor are made of a same material.

10. A display panel, comprising:
an array substrate comprising:
a base substrate,
a buffer layer disposed on the base substrate,
an interlayer dielectric layer disposed on the buffer layer, and
a protection layer disposed on the interlayer dielectric layer, and
an array substrate further comprising:
a transistor, and a metal light shielding layer; and
the array substrate further comprises a plurality of first test units, a plurality of second test units, a plurality of test leads, and a plurality of connecting wires, wherein
for the plurality of first test units:
the plurality of first test units comprise at least one of: a first electrostatic test unit, a first power test unit, a first backup test unit, a first sensing transistor test unit;
each of the plurality of first test units comprises two layers of test conductor layers arranged by stack,
the two layers of test conductor layers are connected to each other, the interlayer dielectric layer is disposed between the two layers of test conductor layers, and
one layer of test conductor layers is disposed in a same layer with a source/drain of the transistor, and the other layer of test conductor layers is disposed in a same layer with a gate of the transistor;
for the plurality of second test units:
the plurality of second test units comprise at least one of: a second electrostatic test unit, a second power test unit, a second backup test unit, a second sensing transistor test unit;
each of the plurality of second test units comprises two layers of detecting conductor layers arranged by stack,
the two layers of detecting conductor layers are connected to each other, the buffer layer and the interlayer dielectric layer are disposed between the two layers of detecting conductor layers, and
one layer of detecting conductor layers is disposed in a same layer with the metal light shielding layer, and the other layer of detecting conductor layers is disposed in a same layer with the source/drain of the transistor; and
for the plurality of test leads:
the plurality of test leads are connected to the plurality of first test units in a one-to-one correspondence;
the plurality of test leads are disposed in at least two different layers;
the plurality of test leads comprise at least two of: a first test lead, a second test lead, and a third test lead, the first test lead being disposed in the metal light shielding layer in a same layer, the second test lead being disposed in a same layer as the gate of the transistor, the third test lead being disposed in a same layer as the source/drain of the transistor; and
for the plurality of connecting wires:
the respective connecting wires are connected between the plurality of first test units and the plurality of second test units in a one-to-one correspondence.

11. The display panel according to claim 10, wherein the display panel is provided in a display device.

12. The display panel according to claim 10, wherein:
the first test lead and the metal light shielding layer are made of a same material;
the second test lead and the gate of the transistor are made of a same material; and
the third test lead and the source/drain of the transistor are made of a same material.

13. The display panel according to claim 10, wherein:
the first test lead and the metal light shielding layer are disposed between the base substrate and the buffer layer;
the second test lead and the gate are disposed between the buffer layer and the interlayer dielectric layer; and
the third test lead and the source/drain are disposed between the interlayer dielectric layer and the protection layer.

14. The display panel according to claim 13, wherein the two layers of the test conductor layers comprise:
a first test conductor layer disposed between the buffer layer and the interlayer dielectric layer; and
a second test conductor layer disposed on the interlayer dielectric layer and connected to the first test conductor layer through a first via hole provided in the interlayer dielectric layer.

* * * * *